US011688695B2

(12) United States Patent
Liu et al.

(10) Patent No.: US 11,688,695 B2
(45) Date of Patent: Jun. 27, 2023

(54) SEMICONDUCTOR DEVICES WITH SHIELDING STRUCTURES

(71) Applicant: Yangtze Memory Technologies Co., Ltd., Hubei (CN)

(72) Inventors: Wei Liu, Wuhan (CN); Shiqi Huang, Wuhan (CN); Liang Chen, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 191 days.

(21) Appl. No.: 17/113,706

(22) Filed: Dec. 7, 2020

(65) Prior Publication Data

US 2022/0084955 A1 Mar. 17, 2022

Related U.S. Application Data

(63) Continuation of application No. PCT/CN2020/114724, filed on Sep. 11, 2020.

(51) Int. Cl.
H01L 23/552 (2006.01)
H01L 21/768 (2006.01)
(Continued)

(52) U.S. Cl.
CPC ...... *H01L 23/552* (2013.01); *H01L 21/76898* (2013.01); *H01L 23/481* (2013.01);
(Continued)

(58) Field of Classification Search
CPC . H01L 21/76898; H01L 23/481; H01L 25/18; H01L 25/50; H01L 23/5286;
(Continued)

(56) References Cited

U.S. PATENT DOCUMENTS

| 7,221,034 B2 | 5/2007 | Ma et al. |
| 7,253,492 B2 | 8/2007 | Ma et al. |
| 8,227,708 B2 | 7/2012 | Li et al. |
| 2005/0189588 A1 | 9/2005 | Ma et al. |

(Continued)

FOREIGN PATENT DOCUMENTS

| CN | 102280421 A | 12/2011 |
| CN | 110574162 | 12/2019 |

(Continued)

OTHER PUBLICATIONS

International Search Report dated Jun. 21, 2021 in PCT/CN2020/114724, citing documents AA, AB, and AO through AQ therein, 5 pages.

*Primary Examiner* — Herve-Louis Y Assouman
(74) *Attorney, Agent, or Firm* — Oblon, McClelland, Maier & Neustadt, L.L.P.

(57) ABSTRACT

Aspects of the disclosure provide a semiconductor device. The semiconductor device includes a first die. The first die includes a semiconductor substrate with transistors formed on a first side of the semiconductor substrate. Further, the first die includes a connection structure extending through the semiconductor substrate and conductively connecting a first conductive layer disposed on the first side of the semiconductor substrate with a second conductive layer disposed on a second side of the semiconductor substrate that is opposite to the first side of the semiconductor substrate. Further, the first die includes a shielding structure disposed in the semiconductor substrate and between the connection structure and at least a transistor. The shielding structure includes a third conductive layer and can alleviate coupling between the connection structure and the transistor.

20 Claims, 7 Drawing Sheets

(51) Int. Cl.
*H01L 23/48* (2006.01)
*H01L 25/18* (2023.01)
*H01L 25/00* (2006.01)
*H01L 23/00* (2006.01)
*H01L 23/528* (2006.01)

(52) U.S. Cl.
CPC .............. *H01L 25/18* (2013.01); *H01L 25/50* (2013.01); *H01L 23/5286* (2013.01)

(58) Field of Classification Search
CPC ... H01L 24/08; H01L 24/80; H01L 27/11575; H01L 27/11582; H01L 2224/08145; H01L 2225/06541; H01L 27/11573; H01L 27/11519; H01L 27/11524; H01L 27/11529; H01L 23/552
See application file for complete search history.

(56) References Cited

U.S. PATENT DOCUMENTS

| | | |
|---|---|---|
| 2007/0007616 A1 | 1/2007 | Ma et al. |
| 2011/0139497 A1 | 6/2011 | Li et al. |
| 2011/0298130 A1 | 12/2011 | Kang |
| 2017/0330887 A1* | 11/2017 | Kim ................... H01L 27/1157 |
| 2020/0105721 A1* | 4/2020 | Park ....................... H01L 25/18 |
| 2021/0074709 A1 | 3/2021 | Liu |

FOREIGN PATENT DOCUMENTS

| | | |
|---|---|---|
| CN | 110770901 A | 2/2020 |
| CN | 110914987 A | 3/2020 |
| CN | 110914988 | 3/2020 |
| TW | 201839907 | 11/2018 |
| TW | 201916323 | 4/2019 |
| TW | 202002177 | 1/2020 |

* cited by examiner

SEMICONDUCTOR DEVICES WITH SHIELDING STRUCTURES

RELATED APPLICATION

This application is a bypass continuation of International Application No. PCT/CN2020/114724, filed on Sep. 11, 2020. The entire disclosure of the prior application is hereby incorporated by reference in its entirety.

TECHNICAL FIELD

The present application describes embodiments generally related to semiconductor devices and fabrication processes for semiconductor devices.

BACKGROUND

Through silicon contact (TSC) can be used to facilitate forming electric connections between front side metal layers and back side metal layers on wafers. In some examples, on a front side of a wafer, a front side metal layer is connected with a regular contact that is formed from the front side of the wafer. A TSC hole can be formed from the back side of the water by etching through the silicon from the back side of the wafer. The TSC hole can expose the bottom of the regular contact. The TSC hole can be filled with conductive material to form TSC that is in conductively connected with the regular contact. Further, a back side metal layer can be formed in connection with the TSC. Thus, the back side metal layer and the front side metal layer are conductively connected via the TSC and the regular contact.

SUMMARY

Aspects of the disclosure provide a semiconductor device. The semiconductor device includes a first die. The first die includes a semiconductor substrate with transistors formed on a first side of the semiconductor substrate. Further, the first die includes a connection structure extending through the semiconductor substrate and conductively connecting a first conductive layer disposed on the first side of the semiconductor substrate with a second conductive layer disposed on a second side of the semiconductor substrate that is opposite to the first side of the semiconductor substrate. Further, the first die includes a shielding structure disposed in the semiconductor substrate and between the connection structure and at least a transistor. The shielding structure includes a third conductive layer and can alleviate coupling between the connection structure and the transistor.

In some embodiments, the connection structure includes a through substrate contact formed in the semiconductor substrate and a front contact formed on the first side of the semiconductor substrate. The front contact is conductively connected with the through substrate contact, and is conductively connected with the first conductive layer disposed on the first side of the semiconductor substrate. In some examples, the shielding structure can enclose the through substrate contact in the semiconductor substrate.

According to an aspect of the disclosure, the shielding structure extends in a substantial same depth range in the semiconductor substrate as the through substrate contact. In some examples, the third conductive layer in the shielding structure is of a same material as a conductive material in the through substrate contact.

In some embodiments, the shielding structure includes an insulating material disposed between the third conductive layer and the semiconductor substrate. A width of the shielding structure is larger than two times of a thickness of the insulating material between the third conductive layer and the semiconductor substrate.

In some embodiments, the third conductive layer is conductively coupled to a portion of the second conductive layer that receives a constant voltage during operation. In some examples, the third conductive layer is conductively coupled to the portion of the second conductive layer that connects to ground during operation.

In some embodiments, the semiconductor device includes a second die that is stacked with the first die. The second die includes memory cells, and periphery circuitry for the memory cells is formed by the transistors on the first die.

Aspects of the disclosure provide a method for fabricating a semiconductor device. The method includes disposing, from a first side of a die, transistors on a semiconductor substrate of the die, and forming a connection structure that extends through the semiconductor substrate and conductively connects a first conductive layer disposed on the first side of the die and a second conductive layer disposed on a second side of the die that is opposite to the first side. Further, the method includes forming a shielding structure in the semiconductor substrate and between the connection structure and at least a transistor. The shielding structure includes a third conductive layer and can alleviate coupling between the connection structure and the transistor.

To form the connection structure, in some embodiments, the method includes forming from the first side of the die, a front contact on the first side of the semiconductor substrate. The front contact is conductively connected with the first conductive layer disposed on the first side of the die. Then the method includes forming, from the second side of the die, a through substrate contact in the semiconductor substrate. The through substrate contact is conductively connected with the front contact. Further, to form the shielding structure, the method includes forming, from the second side of the die, the shielding structure that encloses the through substrate contact in the semiconductor substrate.

In some embodiments, the method includes forming, from the second side of the die, a hole for the through substrate contact and a trench for the shielding structure in same processing steps. In some examples, the method includes thinning the semiconductor substrate from the second side of the die and etching the semiconductor substrate from the second side of the die based on a mask that includes a first pattern for the through substrate contact and a second pattern for the shielding structure.

In some embodiments, the method includes forming an insulating layer on sidewalls of the hole and on sidewalls of the trench; and filing the third conductive layer in the hole and the trench.

In some embodiments, the method includes forming, from the second side of the die, the second conductive layer. A portion of the second conductive layer is connected with the third conductive layer of the shielding structure. In some examples, the portion of the second conductive layer is connected to a pad structure that receives a constant voltage during operation. For example, the portion of the second conductive layer is connected to the pad structure for ground connection.

In some embodiments, the die is a first die, and the method includes bonding a second die with the first die. The second die has memory cells and periphery circuitry for the memory cells is formed by the transistors on the first die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
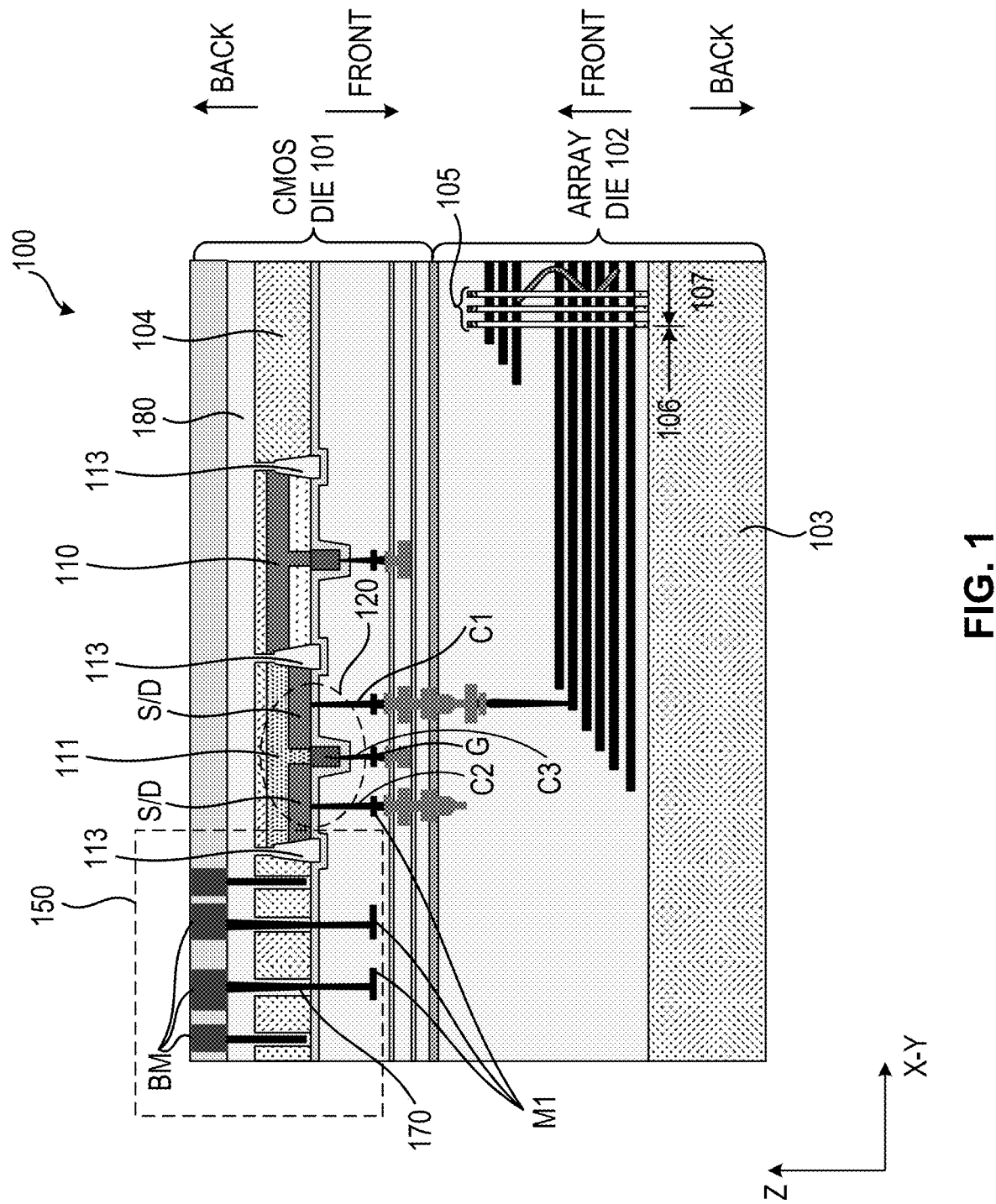
FIG. 1 shows a cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide shielding structures to alleviate couplings between through substrate contacts and a semiconductor substrate. Generally, transistors, regular contacts (also referred to as front contacts) and one or more patterned first conductive layers (e.g., patterned first metal layers) are formed on a first side (also referred to as front side) of a semiconductor substrate. The regular contacts can connect terminals of the transistors, such as source terminals, drain terminals, gate terminals and the like with a patterned first conductive layer disposed on the first side of the semiconductor substrate. Through substrate contacts are formed extending through the semiconductor substrate to conductively connect with some regular contacts to form connection structures that can connect the patterned first conductive layer on the first side of the semiconductor substrate with a patterned second conductive layer (e.g., a patterned second metal layer) disposed on a second side (also referred to as back side) of the semiconductor substrate. The connection structures can be used to transmit signals between the patterned first conductive layer and the patterned second conductive layer.

According to an aspect of the disclosure, signal transmission in the connection structures may cause electric transient noises or electric shock in nearby circuit components, such as transistors, resistors and the like due to coupling. The present disclosure provides shielding structures and techniques to form shielding structures in the semiconductor substrate to alleviate the coupling, and thus to reduce the electric transient noises or electric shock in circuits.

In some examples, a shielding structure includes a conductive layer (also referred to as a third conductive layer) and insulating layers that insulate the conductive layer from the semiconductor substrate. The shielding structure is disposed between at least a through substrate contact and a circuit component, such as a transistor, a resistor, and the like. The shielding structure can alleviate coupling between the through substrate contact and the circuit component. In some embodiments, the shielding structure has a ring shape to enclose one or more through substrate contacts and can alleviate couplings between the enclosed through substrate contacts and circuit components formed in/on the portion of the semiconductor substrate that is outside of the ring of the shielding structure. Thus, changes of the signals transmitted by the through substrate contacts cause little or no effect to operations of circuit components formed in the portion of the semiconductor substrate outside of the ring of the shielding structure. In some embodiments, the conductive layer of the shielding structure is coupled to a constant voltage source, such as ground, during operation to further alleviate the coupling effect.

It is noted that the shielding structures can be used in any suitable semiconductor device with a semiconductor substrate, and the shielding structures can enclose through substrate contacts and alleviate couplings between the through substrate contacts with semiconductor substrate. While in the following description, silicon substrate and through silicon contact (TSC) are used to illustrate shielding structures and techniques to form shielding structures, the disclosed shielding structures and the techniques to form the shielding structures can be used in other suitable semiconductor substrate.

It is also noted that the shielding structures can be used in any suitable type of semiconductor device. While in the following description, a semiconductor device with multiple dies stacked together is used to illustrate shielding structures and techniques to form shielding structures, the disclosed shielding structures and the techniques to form the shielding structures can be used in other semiconductor device, such as with single die. While in the following description, the semiconductor device is a semiconductor device that includes at least one die having memory cell arrays, the disclosed shielding structures and the techniques to form the shielding structures can be used in other semiconductor device without memory cell arrays.

FIG. 1 shows a cross-sectional view of a semiconductor device 100 according to some embodiments of the disclosure. The semiconductor device 100 includes two dies 101 and 102 that are bonded face to face. At least one of the two dies that is referred to as a first die, has a patterned metal layer disposed on a back side of the first die. Connection structures are used to couple the patterned metal layer on the back side of the first die to another patterned metal layer on the front side of the first die. The connection structures include through substrate contacts formed in the semiconductor substrate. Further, shielding structures can be disposed in the semiconductor substrate between through substrate contacts and circuit components formed in the semiconductor substrate to alleviate couplings between the through substrate contacts and the circuit components.

Specifically, in the semiconductor device 100, the die 102 includes a memory cell array formed on the front side and can be referred to as an array die 102 and the die 101 includes periphery circuitry formed on the front side and can be referred to as periphery die 101. In some examples, the periphery circuitry is formed using complementary metal-oxide-semiconductor (CMOS) technology, and the periphery die 101 is also referred to as CMOS die 101.

It is noted that, in some embodiments, a semiconductor device can include multiple array dies and a CMOS die. The multiple array dies and the CMOS die can be stacked and bonded together. The CMOS die is respectively coupled to the multiple array dies, and can drive the respective array dies to operate in the similar manner as the semiconductor device 100.

The semiconductor device 100 can be any suitable device. In some examples, the semiconductor device 100 includes at least a first wafer and a second wafer bonded face to face. The array die 102 is disposed with other array dies on the first wafer, and the CMOS die 101 is disposed with other CMOS dies on the second wafer. The first wafer and the second wafer are bonded together, thus the array dies on the first wafer are bonded with corresponding CMOS dies on the second wafer. In some examples, the semiconductor device 100 is a chip with at least the array die 102 and the CMOS die 101 bonded together. In an example, the chip is diced from wafers that are bonded together. In another example, the semiconductor device 100 is a semiconductor package that includes one or more semiconductor chips assembled on a package substrate.

The array die 102 includes a substrate 103, and memory cells formed on the substrate 103. The CMOS die 101 includes a substrate 104, and peripheral circuitry formed on the substrate 104. For simplicity, the main surface of the substrate 103 is referred to as an X-Y plane, and the direction perpendicular to the main surface is referred to as Z direction.

The substrate 103 and the substrate 104 respectively can be any suitable substrate, such as a silicon (Si) substrate, a germanium (Ge) substrate, a silicon-germanium (SiGe) substrate, and/or a silicon-on-insulator (SOI) substrate. The substrate 103 and the substrate 104 respectively may include a semiconductor material, for example, a Group IV semiconductor, a Group III-V compound semiconductor, or a Group II-VI oxide semiconductor. The Group IV semiconductor may include Si, Ge, or SiGe. The substrate 103 and the substrate 104 respectively may be a bulk wafer or an epitaxial layer.

The semiconductor device 100 includes memory cell arrays and peripheral circuitry (e.g., the address decoding circuit, the page buffer circuit, the data I/O circuit, the voltage generator, the main controller and the like). In the FIG. 1 example, the memory cell arrays are formed on a front side of the substrate 103 and the peripheral circuitry is formed on a front side of the substrate 104 of the CMOS die 101. The array die 102 and the CMOS die 101 are disposed face to face and bonded together. It is noted that generally, transistors are disposed on a front side (also referred to as first side in some examples) of a substrate, the opposite side of the substrate is referred to as a back side (also referred to as second side in some examples), and the surface of the front side can be referred to as face.

In the FIG. 1 example, a block of three dimensional (3D) NAND memory cell strings can be formed on the array die 102. In some examples, the array die 102 includes a staircase region 106 and a core region 107. The memory cells can be formed in the core region 106 as an array of vertical memory cell strings 105. In the FIG. 1 example, vertical memory cell strings 105 are shown as representation of an array of vertical memory cell strings formed in the core region 107.

The staircase region 106 (also referred to as a connection region in some examples) is used to facilitate making connections to, for example, gates of the memory cells in the vertical memory cell strings, gates of the select transistors, and the like. The gates of the memory cells in the vertical memory cell strings correspond to word lines for the NAND memory architecture.

According to an aspect of the disclosure, the CMOS die 101 includes periphery circuity formed using CMOS technology. For example, the CMOS die 101 includes P-type doped wells 111 and N-type doped wells 110 formed in active areas (AAs) of the substrate 104, the P-type doped wells 111 and the N-type doped wells 110 can be insulated by shallow trench isolation (STI) structures 113. P-type transistors can be formed in the N-type doped wells 110 and N-type transistors can be formed in the P-type doped wells 111.

According to an aspect of the disclosure, the P-type transistors and the N-type transistors are suitable coupled to form CMOS circuit. In some examples, the terminals of the N-type transistors and P-type transistors are coupled to patterned metal layers disposed on the front side of the CMOS die 101. FIG. 1 shows an N-type transistor 120 disposed in the P-type doped well 111. The N-type transistor 120 includes source/drain (S/D) terminals and a gate terminal (G), the S/D terminals and the G terminal are connected to a patterned metal layer that is referred to as M1 via regular contact structures. For example, the S/D terminals are connected to M1 via regular contact structures C1 and C2, and the gate terminal is connected to M1 via a regular contact structure C3. The patterned metal layer M1 can be connected to other metal layers (e.g., M2, M3, . . . ) disposed on the front side of the CMOS die 101 using via structures.

Further, according to an aspect of the disclosure, one of the array die 102 and the CMOS die 101 is configured to include backside metal layers on the back side of the substrate. The backside metal layers can be used to provide pad structures and/or routing paths. The pad structures can be formed to facilitate attachment of bonding wires that can conductively couple the pad structures with external components, such as power supply, ground, other semiconductor devices, metal wires on printed circuit board (PCB) and the like. In some embodiments, input/output circuits are disposed on the CMOS die 101, thus when the pad structures are formed on the back of the CMOS die 101, the signal paths for the input/output signals can be relatively short comparing to the pad structures being formed on the back of the array die 102.

In the FIG. 1 example, the CMOS die 101 includes a patterned backside metal layer BM that is disposed on an insulating layer 180 on the back side of the CMOS die 101. Further, the CMOS die 101 includes connection structures formed in active areas to connect the patterned backside metal layer BM on the back side of the CMOS die 101 with the patterned metal layer M1 on the front side of the CMOS die 101. In some embodiments, each connection structure includes a through silicon contact (TSC) and a front contact that are conductively connected together. The front contact is formed by processing on the front side of the CMOS die 101 and the TSC is formed by processing on the back side of the CMOS die 101. Further, the TSC can be protected by a shielding structure to alleviate couplings between the TSC and circuit components formed in the substrate 104, such as the N-type transistor 120 and the like. A portion 150 of the CMOS die 101 is shown in FIG. 2A and FIG. 2B to further illustrate shielding structures according to some embodiments of the disclosure.

Figure 2:
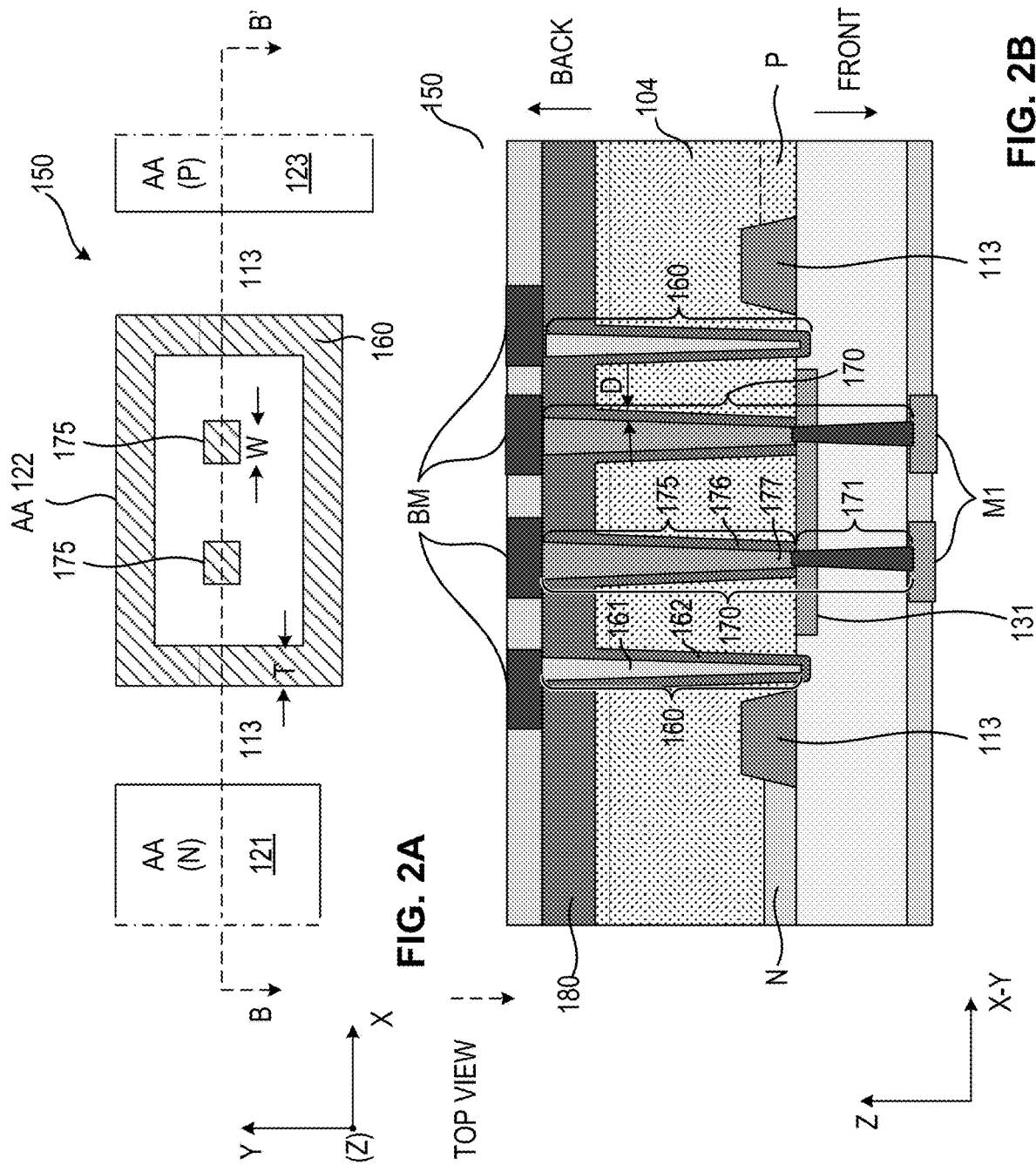
FIG. 2A shows a top view of a portion of a semiconductor device.
FIG. 2B shows a cross-sectional view of the portion of the semiconductor device according to some embodiments of the disclosure.

FIG. 2A shows a top view of the portion 150 of the CMOS die 101, and the FIG. 2B shows a cross-sectional view of the portion 150 of the CMOS die 101 a long B-B' line shown in FIG. 2A according to some embodiments of the disclosure. It is noted that, for ease of illustration, FIG. 2A shows patterns of some components (e.g., active area, TSC, shielding structure) in the CMOS die 101, and omit patterns of other components.

As shown by FIGS. 2A and 2B, the portion 150 includes active areas AA 121, AA 122 and AA 123 that are insulated by STI structures 113. In an example, the active area AA 121 can include a N-type doped well and can include P-type transistors formed in the N-type doped well; the active area AA 123 can include a P-type doped well and can include N-type transistors formed in the P-type doped well. Further, connection structures 170 are formed in the active area AA 122, and connect the patterned metal layer M1 on the front side of CMOS die 101 with the patterned metal layer BM on the back side of the CMOS die 101. In some examples, each connection structure 170 includes a front contact 171 and a TSC 175 that are conductively connected together. The front contact 171 is formed from processing on the front side of the CMOS die 101 and is connected to the patterned metal layer M1 on the front side of the CMOS die 101. The TSC 175 is formed from processing on the back side of the CMOS die 101 to connect with the front contact 171. Further, from processing on the back side of the CMOS die 101, the TSC 175 is connected to the patterned metal layer BM on the back side of the CMOS die 101.

In some embodiments, the front contact 171 can be formed in a similar manner as contacts to the S/D terminals of transistors except a blockage of a self-aligned silicide. In an example, the S/D terminals are formed in heavily doped silicon. To form good contacts to the S/D terminals, in an example, self-aligned silicide process (salicide process) is used. In an example, the salicide process begins with a deposition of a thin transition metal layer (e.g., titanium, cobalt, nickel, platinum, and tungsten) over a wafer. The wafer is heated, allowing the transition metal to react with exposed silicon in the active areas of the semiconductor device (e.g., source terminals, drain terminals, gate terminals) forming a low-resistance transition metal silicide. The transition metal does not react with the silicon dioxide nor the silicon nitride insulators (e.g., STI structures 113) present on the wafer. Following the reaction, any remaining transition metal can be removed by chemical etching.

In the active area AA 122, a salicide block 131 is formed to prevent forming self-aligned silicide. The salicide block 131 can be a dielectric layer (e.g., silicon dioxide or silicon nitride) that is patterned by photo-lithography process and etch process.

In some embodiments, the front contacts 171 in the active area AA 122 can be formed in a same manner as the contacts to the S/D terminals. For example, suitable insulating layer(s) (e.g., silicon dioxide, silicon nitride, and the like) can be deposited, and an etch process is used to form contact holes for the front contacts 171, the S/D contacts, and the gate contacts in the insulating layer(s). The etch process can stop at the interface to silicon. The contact holes are then filled with metal material to form the contacts. Then, the patterned metal layer M1 can be formed from processing on the front side of the CMOS die 101, and are suitably connected with the front contact structures 171 and the other contact structures, such as the S/D contacts, the gate contacts, and the like.

In the FIG. 2A and FIG. 2B example, the TSCs 175 are formed in the active area AA 122 by processing from the back side of the CMOS die 101. In an example, the silicon substrate 104 is thinned to reduce the thickness of the silicon, then through silicon holes can be generated by etching through the silicon substrate 104. The through silicon holes can expose the bottom of the front contact 171 from the back side of the silicon substrate 104. Then, the through silicon holes can be filled with suitable layers to form the TSCs 175. For example, an insulating layer 176 is formed on the sidewalls of the through silicon holes, and a metal material 177 is filled in the through silicon holes to connect with the bottom of the front contacts 171.

According to an aspect of the disclosure, the structure of the TSCs 175 can induce capacitive coupling between the metal material 177 and nearby silicon substrate. When the metal material 177 is used for signal transmission, the changes (e.g., voltage changes) in the signals may cause, for example voltage changes in the nearby silicon substrate, and then may cause signal noises in the nearby transistors during operation.

According to some aspects of the present disclosure, a shielding structure 160 is disposed between TSCs 175 and nearby transistors. In some examples, the shielding structure 160 includes a conductive layer, such as a metal material 161. The metal material 161 is insulated from the silicon substrate 104 by an insulating material 162. The shielding structure 160 can block the electric field and reduce the coupling from the TSCs 175 to the nearby transistors.

In some embodiments, the shielding structure 160 encloses the TSCs 175, and transistors are formed outside of the enclosed region by the shielding structure 160. Thus, changes in the signals transmitted by the TSCs 175 are blocked by the shielding structure 160, and cause little or no signal changes in the transistors outside of the enclosed region by the shielding structure 160. In the FIG. 2A example, the shielding structure 160 has a closed donut shape from the top view, and can enclose one or more TSCs 175.

It is noted that, in some embodiments, the donut shape of the shielding structure 160 is not closed, and may have an opening (not shown) from the top view.

In some embodiments, the metal material 161 is connected to a routing path formed using the patterned metal layer BM, and routing path can connect the metal material 161 to a pad structure that receives a constant voltage level, such as ground during operation.

According to some aspects of the disclosure, the shielding structure 160 extends in the silicon substrate 104 in the Z direction about the same depth range as the TSCs 175. In some examples, the thickness (T shown in FIG. 2A) of the shielding structure 160 is about the same as the width (W shown in FIG. 2A) of the TSCs 175. In some example, the thickness (T shown in FIG. 2A) of the shielding structure 160 is larger than two times of the thickness (D shown in FIG. 2B) of the insulating layer 176. In some embodiments, the shielding structure 160 and the TSCs 175 can be formed at the same time with patterns defined using a same mask.

Figure 3:
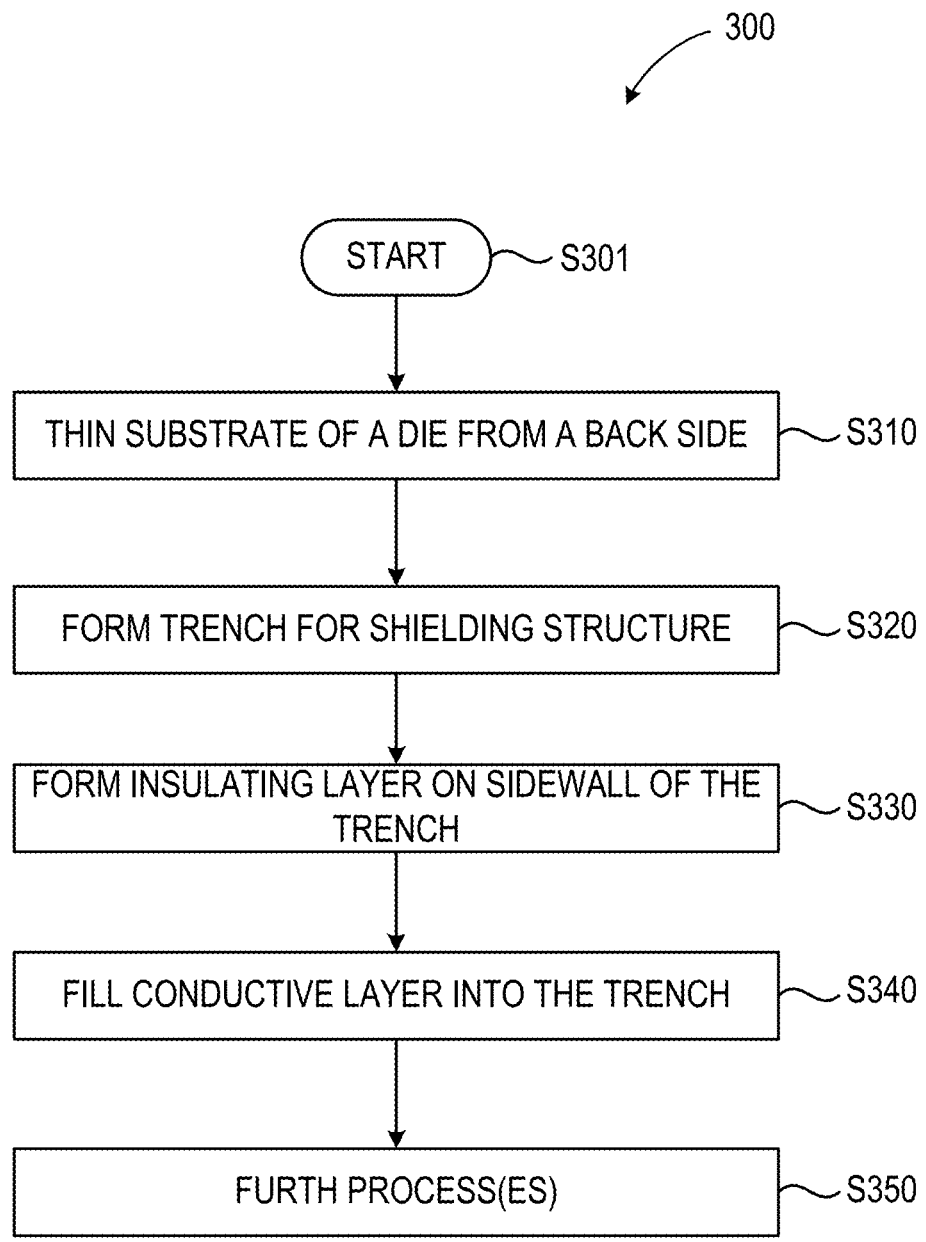
FIG. 3 shows a flow chart outlining a process for forming a semiconductor device according to some embodiments of the disclosure.

FIG. 3 shows a flow chart outlining a process 300 for forming a semiconductor device, such as the semiconductor device 100 according to some embodiments of the disclosure, and FIGS. 4-7 show cross-sectional views of the semiconductor device 100 during the process in accordance with some embodiments. The process 300 starts from S301 and proceeds to S310.

At S310, substrate of a die is thinned from a back side of the die. For example, the CMOS die 101 and the array die 102 are bonded face to face and then the CMOS die 101 is thinned from the back side of the CMOS die 101.

Figure 4:
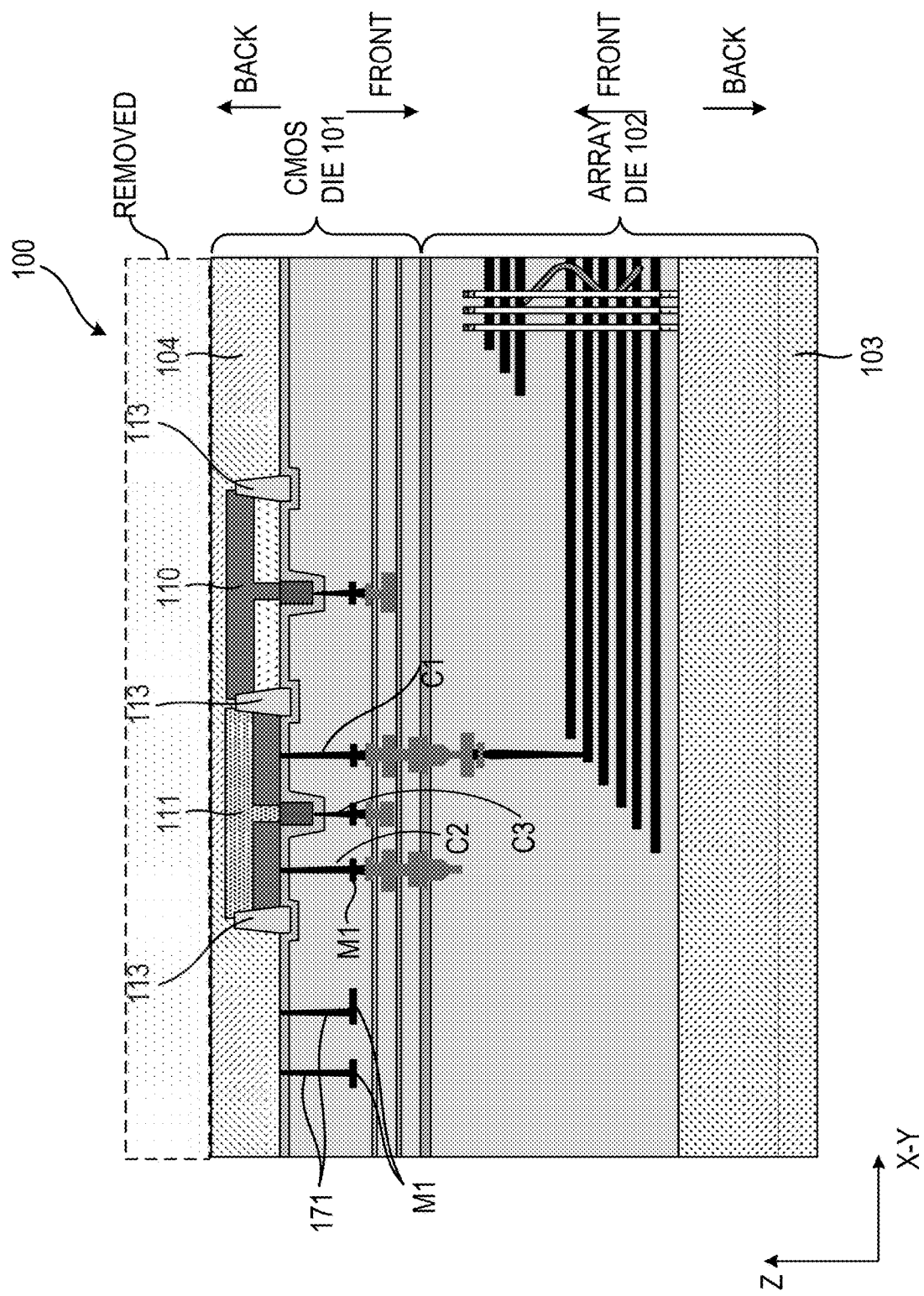
FIGS. 4-7 show cross-sectional views of a semiconductor device during a fabrication process in accordance with some embodiments.

FIG. 4 shows a cross-sectional view of the semiconductor memory device 100 after a portion of the substrate 104 is removed from the back side by a thinning process. The semiconductor memory device 100 includes the array die 102 and the CMOS die 101 that are bonded face to face. Then, the substrate 104 is thinned from the back side to remove a portion of the substrate 104 as shown by "REMOVED" in FIG. 4.

In some embodiments, the CMOS die 101 is fabricated with other CMOS dies on a first wafer and the array die 102 is fabricated with other array dies on a second wafer. In some examples, the first wafer and the second wafer are fabricated separately.

In some examples, periphery circuitry is formed on the first wafer using CMOS processes that operate on the face side of the first wafer. In an example, STI structures 113 are formed to define active areas, and suitable doping processes can be performed to form P-type doped wells and N-type doped wells. Further, the gate terminals of transistors are formed, and the source/drain terminals of transistors are formed. In some examples, a salicide process may be used, and a salicide block, such as the salicide block 131 is used to block the silicide formation in an active area, such as the active area 122, that is used for forming connection structures that connect a front side metal layer with a back side metal layer.

Further, suitable insulating material can be deposited, and contacts and a front side metal layer can be formed. For example, the contacts C1, C2 and C3 and the front contacts 171 can be formed using the same contact forming processes. Then, the metal layer M1 can be deposited and patterned. Further, in some examples, backend of line (BEOL) processes can be performed to form additional metal layers, and first bonding structures on the front side of the first wafer (e.g., front side of CMOS die 101).

Similarly, memory cell arrays are formed on the second wafer using processes that operate on the front side of the second wafer, and second bonding structures are formed on the face side of the second wafer.

In some embodiments, the first wafer and the second wafer can be bonded face to face using a wafer-to-wafer bonding technology. The first bonding structures on the first wafer are bonded with corresponding second bonding structures on the second wafer, thus the CMOS dies on the first wafer are respectively bonded with the array dies on the second wafer.

In some examples, after a wafer-to-wafer bonding process, the first wafer is thinned from the back side of the first wafer. In an example, a chemical mechanical polishing (CMP) process or a grind process is used to remove a portion of the bulk silicon from the back side of the first wafer.

Referring back to FIG. 3, at S320, a trench in the substrate is generated by processing on the back side of the die. The trench is for forming a shielding structure. In some embodiments, the trench is generated with holes for TSCs.

Figure 5:
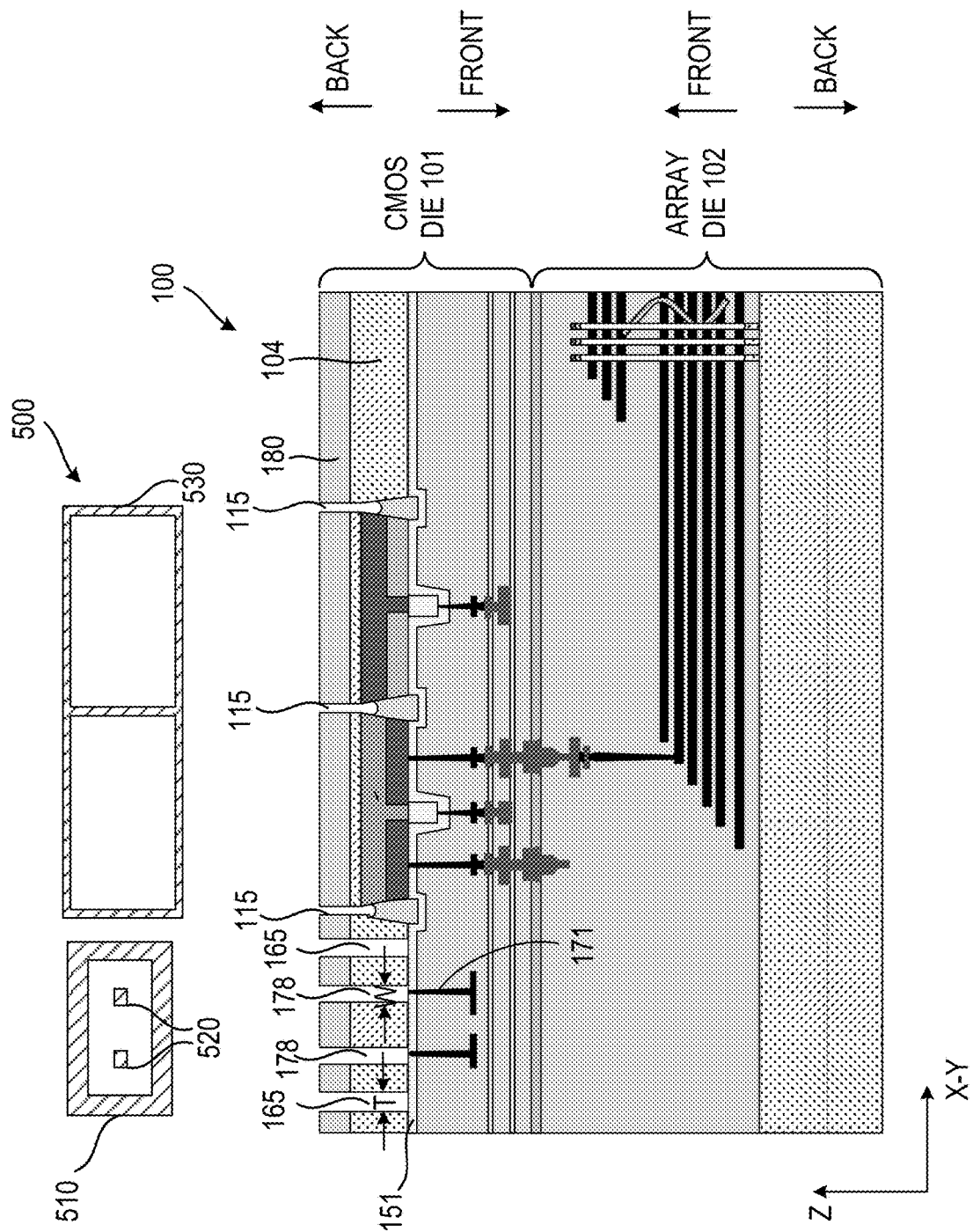

FIG. 5 shows a cross-sectional view of the semiconductor device 100 after a trench 165 for forming the shielding structure is generated in the substrate 104. In some examples, an insulating layer 180 is deposited on the backside of the substrate 104, and a mask 500 is used to define the trench 165 in the insulating layer 180 and the substrate 104. In the FIG. 5 example, the mask 500 includes various patterns, such as a first pattern 510, second patterns 520, a third pattern 530 and the like. The first pattern 510 corresponds to the shielding structure and the first pattern 510 can be transferred by an etch process into the insulating layer 180 and the substrate 104 as the trench 165 that stops at an interface to an insulating layer 151 disposed on the front side of the silicon substrate 104. The second patterns 520 correspond to TSCs and the second patterns 520 can be transferred by the etch process into the insulating layer 180 and the substrate 104 as holes 178 that stop at the interface to the insulating layer 151. The third pattern 530 corresponds to backside deep trench ring (BDTI) that is used in some examples to isolate wells (e.g., P-type doped wells and N-type doped wells). The third pattern 530 is transferred by the etch process into the substrate 104 as a trench 115 that stops on the STI structures 113.

It is noted that in some examples, the width of the trench 115 is narrower than the trench 165. In an example, the width of the trench 115 is equal to or smaller than two times of the thickness (D shown in FIG. 2B) of the insulating layer 176 that will be deposited, and the width (shown by T in FIG. 5) of the trench 165 is larger than two times of the thickness (D shown in FIG. 2B) of the insulating layer 176 that will be deposited. The width (shown by W in FIG. 5) of the holes 178 is also larger than two times of the thickness (D shown in FIG. 2B) of the insulating layer 176 that will be deposited.

Referring back to FIG. 3, at S330, an insulating layer is formed on the sidewall of the trench.

Figure 6:
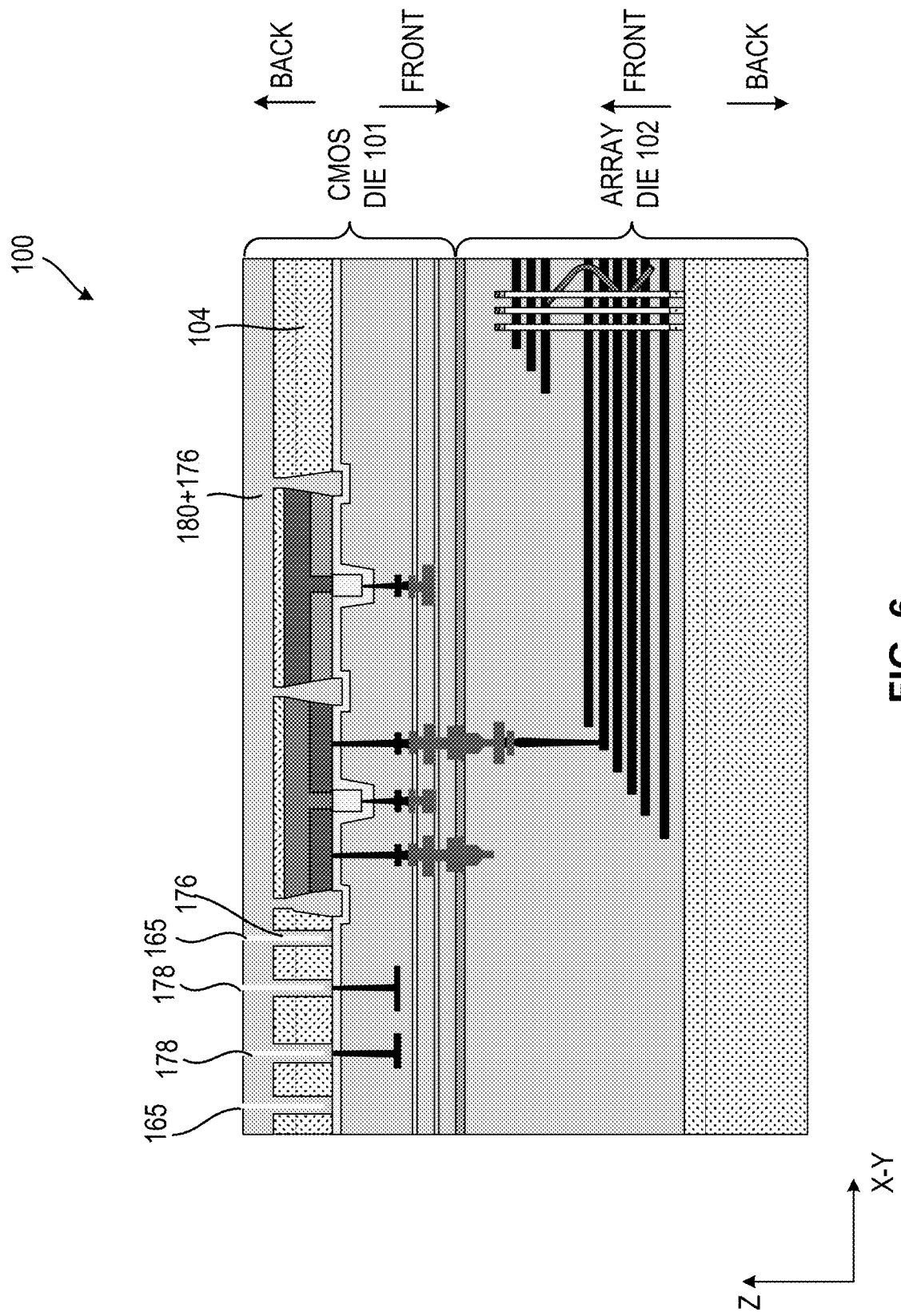

FIG. 6 shows a cross-sectional view of the semiconductor device 100 after the insulating layer 176 is deposited on the back side of the CMOS die 101. In some embodiments, the insulating layer 176 is deposited using a deposition technology that generates a conformal thin film layer. For example, atomic layer deposition (ALD) can be used to form the insulating layer 176. The thickness of the insulating layer 176 can be controlled to fully fill the trench 115 (in FIG. 5) to form the BDTI. For the holes 178 and the trench 165, the insulating layer 176 is deposited on the side walls and bottom.

It is noted that the width of the trench 165 and the width of the holes 178 are larger than two times of the thickness of the insulating layer 176, thus the trench 165 and the holes 178 are not completely filled by the insulating layer 176.

Referring back to FIG. 3, at S340, a conductive layer is filled into the trench.

Figure 7:
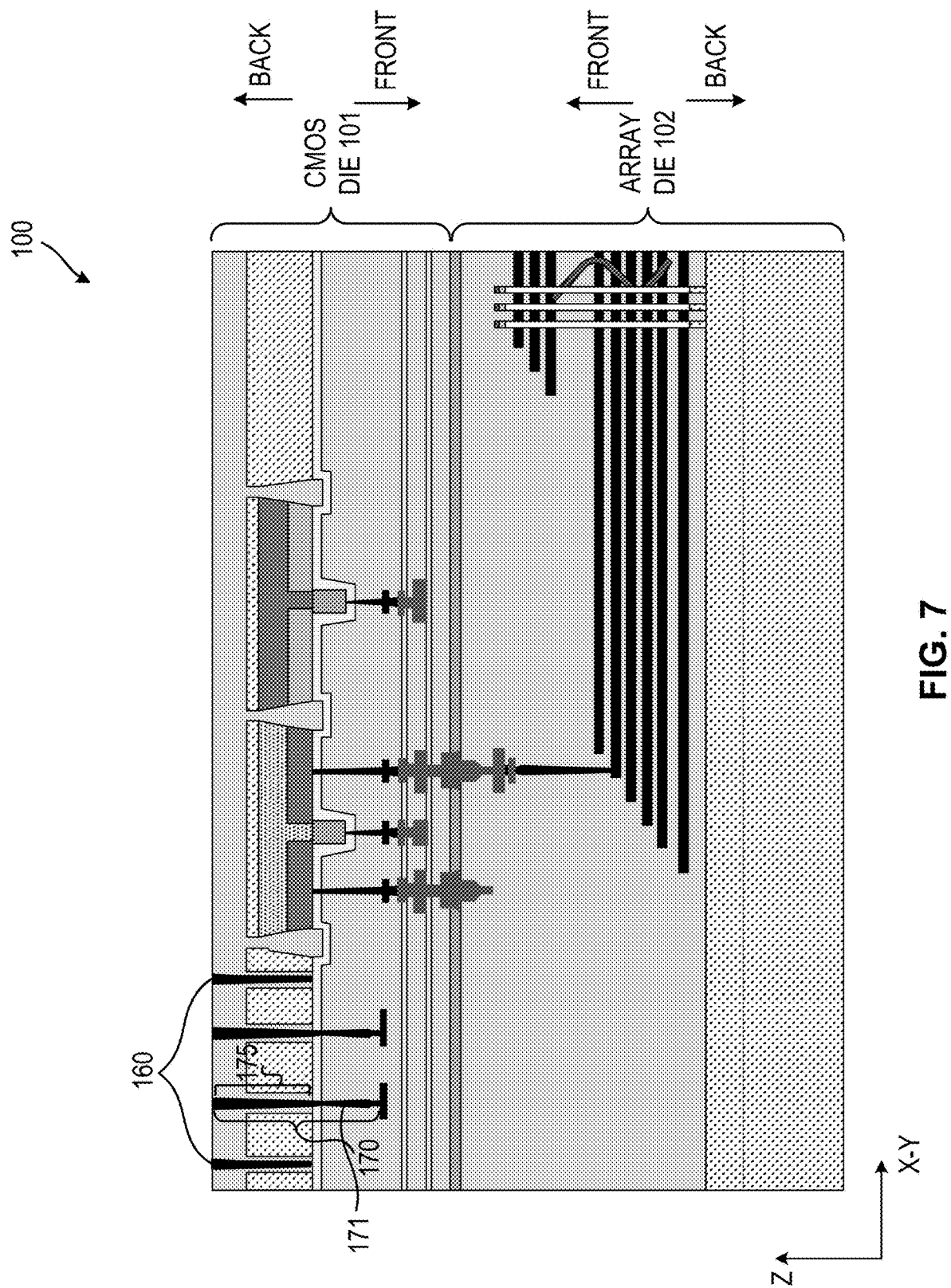

FIG. 7 shows a cross-sectional view of the semiconductor device 100 after a metal filling process is performed on the back side of the CMOS die 101.

In some example, after the deposition of the insulating layer 176, an etch process can be performed to remove the insulating layer 176 at the bottom of the holes 178. The removal of the insulating layer 176 at the bottom of the holes 178 reveals the ends of front contacts 171. It is noted that at the bottom of the trench 165, the insulating layer 176 interfaces the insulating layer 151 that is formed on the front side, thus the removal of the insulating layer 176 at the bottom of the trench 165 does not affect the insulation of the shielding structure. In some embodiments, the trench 165 can be suitably protected from the removal of the insulating layer 176 at the bottom of the trench 165.

Then, a metal layer is filled into the trench 165 and the holes 178. In the holes 178, the filled metal layer is in contact with the end of the front contact 171 and forms the TSC 175, and thus a connection structure 170 is formed by the front contact 171 and the TSC 175. In the trench 165, the filled metal layer forms the conductive layer for the shielding structure 160.

In some examples, tungsten is deposited to fill the trench 165 and the holes 178 and the portion of the tungsten on the surface of the insulating layer 180 can be removed by CMP process.

Referring back to FIG. 3, at S350, additional processes can be further performed. For example, the backside metal layer BM can be formed and patterned. The patterned metal layer BM can form routing paths and pad structures. The cross-sectional view of the semiconductor device 100 with the patterned metal layer BM is shown in FIG. 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first die that comprises
        a semiconductor substrate with transistors formed on a first side of the semiconductor substrate;
        a connection structure extending through the semiconductor substrate and conductively connecting a first conductive layer disposed on the first side of the semiconductor substrate and a second conductive layer disposed on a second side of the semiconductor substrate that is opposite to the first side of the semiconductor substrate; and
        a shielding structure disposed in the semiconductor substrate and between the connection structure and at least a transistor, the shielding structure comprising a third conductive layer, the shielding structure having a cross section parallel to the first side of the semiconductor substrate, the cross section forming an enclosed region within which a through substrate contact formed in the semiconductor substrate is enclosed and outside of which the transistor is formed.

2. The semiconductor device of claim 1, wherein the connection structure comprises:
    the through substrate contact formed in the semiconductor substrate; and
    a front contact formed on the first side of the semiconductor substrate and conductively connected with the through substrate contact, the front contact being conductively connected with the first conductive layer disposed on the first side of the semiconductor substrate.

3. The semiconductor device of claim 2, wherein the cross section of the shielding structure has a donut shape.

4. The semiconductor device of claim 2, wherein the shielding structure is configured to extend in a substantial same depth range in the semiconductor substrate as the through substrate contact.

5. The semiconductor device of claim 2, wherein: the third conductive layer in the shielding structure is of a same material as a conductive material in the through substrate contact.

6. The semiconductor device of claim 1, wherein: the shielding structure comprises an insulating material disposed between the third conductive layer and the semiconductor substrate.

7. The semiconductor device of claim 6, wherein a width of the shielding structure is larger than two times of a thickness of the insulating material between the third conductive layer and the semiconductor substrate.

8. The semiconductor device of claim 1, wherein the third conductive layer is conductively coupled to a portion of the second conductive layer that receives a constant voltage during operation.

9. The semiconductor device of claim 8, wherein the third conductive layer is conductively coupled to the portion of the second conductive layer that connects to ground during operation.

10. The semiconductor device of claim 1, further comprising: a second die being stacked with the first die, the second die comprising memory cells, wherein periphery circuitry for the memory cells is formed by the transistors on the first die.

11. A method for fabricating a semiconductor device, comprising:
    disposing, from a first side of a die, transistors on a semiconductor substrate of the die;
    forming a connection structure that extends through the semiconductor substrate and conductively connects a first conductive layer disposed on the first side of the die and a second conductive layer disposed on a second side of the die that is opposite to the first side; and
    forming a shielding structure in the semiconductor substrate and between the connection structure and at least a transistor, the shielding structure comprising a third conductive layer, the shielding structure having a cross section parallel to the first side of the die, the cross section forming an enclosed region within which a through substrate contact formed in the semiconductor substrate is enclosed and outside which the transistors are formed.

12. The method of claim 11, wherein forming the connection structure further comprises:
    forming, from the first side of the die, a front contact on the first side of the die, the front contact being conductively connected with the first conductive layer disposed on the first side of the die; and
    forming, from the second side of the die, the through substrate contact in the semiconductor substrate, the through substrate contact being conductively connected with the front contact.

13. The method of claim 11, wherein the cross section of the connection structure has a donut shape.

14. The method of claim 12, further comprising: forming, from the second side of the die, a hole for the through substrate contact and a trench for the shielding structure in same processing steps.

15. The method of claim 14, further comprising: thinning the semiconductor substrate from the second side of the die; etching the semiconductor substrate from the second side of the die based on a mask that comprises a first pattern for the through substrate contact and a second pattern for the shielding structure.

16. The method of claim 14, further comprising: forming an insulating layer on sidewalls of the hole for the through substrate contact and on sidewalls of the trench for the shielding structure; and filing the third conductive layer in the hole for the trough substrate contact and in the trench for the shielding structure.

17. The method of claim 16, further comprising: forming, from the second side of the die, the second conductive layer, a portion of the second conductive layer being connected with the third conductive layer of the shielding structure.

18. The method of claim 17, wherein the portion of the second conductive layer is connected to a pad structure that receives a constant voltage during operation.

19. The method of claim 18, wherein the portion of the second conductive layer is connected to the pad structure for ground connection.

20. The method of claim 11, wherein the die is a first die, and the method further comprises: bonding a second die with the first die, the second die having memory cells, wherein periphery circuitry for the memory cells is formed by the transistors on the first die.

\* \* \* \* \*